(12) United States Patent
Lee et al.

(10) Patent No.: US 8,551,687 B2
(45) Date of Patent: Oct. 8, 2013

(54) ALKALI DEVELOPABLE PHOTOSENSITIVE RESIN COMPOSITION AND DRY FILM MANUFACTURED BY THE SAME

(75) Inventors: Kwang-Joo Lee, Daejeon Metropolitan (KR); Heon-Sik Song, Daejeon Metropolitan (KR); You-Jin Kyung, Daejeon Metropolitan (KR); Joo-Eun Ko, Daejeon Metropolitan (KR); Jung-Il Yoon, Seoul (KR); Jung-Jin Shim, Pohang-si (KR)

(73) Assignee: LG Chem, Ltd., Seoul (KR)

( * ) Notice: Subject to any disclaimer, the term of this patent is extended or adjusted under 35 U.S.C. 154(b) by 25 days.

(21) Appl. No.: 12/451,505

(22) PCT Filed: Aug. 20, 2008

(86) PCT No.: PCT/KR2008/004850
§ 371 (c)(1),
(2), (4) Date: Nov. 16, 2009

(87) PCT Pub. No.: WO2009/025498
PCT Pub. Date: Feb. 26, 2009

(65) Prior Publication Data
US 2010/0113640 A1    May 6, 2010

(30) Foreign Application Priority Data

Aug. 20, 2007   (KR) .................. 10-2007-0083555

(51) Int. Cl.
| G03F 7/027 | (2006.01) |
| G03F 7/004 | (2006.01) |
| G03F 7/037 | (2006.01) |
| G03F 7/028 | (2006.01) |
| G03F 7/031 | (2006.01) |
| G03C 1/04 | (2006.01) |
| C08F 2/52 | (2006.01) |
| C08J 3/28 | (2006.01) |

(52) U.S. Cl.
USPC ............. 430/283.1; 430/270.1; 430/280.1; 430/286.1; 430/906; 522/76; 522/74; 522/134; 522/142; 522/144; 522/149; 522/151; 522/152; 522/164; 522/173; 522/176

(58) Field of Classification Search
USPC ............. 522/76, 74, 134, 135, 142, 144, 149, 522/151, 152, 164, 173, 176, 182; 430/270.1, 280.1, 283.1, 286.1, 906; 428/473.5; 524/514, 506, 507; 525/180, 183
See application file for complete search history.

(56) References Cited

U.S. PATENT DOCUMENTS

| 3,179,614 | A | * | 4/1965 | Edwards ................... 524/726 |
| 3,959,350 | A | * | 5/1976 | Rogers ..................... 528/185 |
| 4,416,973 | A | * | 11/1983 | Goff ...................... 430/281.1 |
| 5,925,498 | A | | 7/1999 | DoMinh et al. |
| 7,030,170 | B2 | | 4/2006 | Tahara et al. |
| 7,169,534 | B2 | | 1/2007 | Baumann et al. |
| 2006/0205891 | A1 | | 9/2006 | Tanaka et al. |
| 2010/0218984 | A1 | | 9/2010 | Yamanaka et al. |

FOREIGN PATENT DOCUMENTS

| CN | 1423169 | 6/2003 |
| CN | 1535299 | 10/2004 |
| CN | 1898299 | 1/2007 |
| JP | 2004-29702 A | 1/2004 |
| JP | 2006-251715 A | 9/2006 |
| JP | 2006-323193 A | 11/2006 |
| JP | 2007-094342 A | 4/2007 |
| WO | WO 2007/086385 A1 | 8/2007 |

* cited by examiner

*Primary Examiner* — Sanza McClendon
(74) *Attorney, Agent, or Firm* — McKenna, Long & Aldridge, LLP

(57) ABSTRACT

The present invention relates to a polyimide photosensitive resin composition that is capable of being developed by an alkali aqueous solution, and a dry film that is produced by the same, and more particularly to a photosensitive resin composition which comprises a) a polyamic acid, b) two or more (meth)acrylate—based compounds that include one or more double bonds between carbons, c) a photopolymerization initiator, d) a phosphorus—based flame retardant, and e) an organic solvent, and a dry film that is produced by the same.

13 Claims, No Drawings

ALKALI DEVELOPABLE PHOTOSENSITIVE RESIN COMPOSITION AND DRY FILM MANUFACTURED BY THE SAME

TECHNICAL FIELD

The present invention relates to a polyimide photosensitive resin composition that is capable of being developed by an alkali aqueous solution, and a dry film that is produced by the same.

This application claims the benefit of PCT/KR2008/004850, filed on Aug. 20, 2008 along with Korean Patent Application No. 2007-0083555, filed on Aug. 20, 2007, both of which are hereby incorporated herein by reference for all purposes in their entirety.

BACKGROUND ART

Since polyimide and a precursor thereof have excellent durability, heat resistance, flame retardancy, mechanical and electronical properties, they are actively used as a base film of a printed circuit board, and a high integrated semiconductor device or a cover film for high integrated multilayered wire board. In the case of a flexible print wiring board, it is a base film that is used in conjunction with copper (Cu) of a copper Clad Laminate (hereinafter, referred to as 'CCL') on which a conductive circuit pattern is formed and a polyimide cover lay film that is used by attaching an adhesive in order to protect a circuit of a conductive circuit pattern and improve the resistance to bendability. The cover lay film is previously punched and processed, and layered on the CCL surface on which the circuit is formed by using the thermal compression method. However, in accordance with the miniaturization and the multifunction of electronic devices, and in particular, the lightness, slimness, shortness, and miniaturization of the portable devices, the design of circuit board used in the electronic devices becomes more highly density, thus the circuit becomes fine. However, a known method in which a hole is formed on a polyimide cover lay film and an operator aligns it with the circuit on the CCL has a problem in that since the position precision is low, the current cover lay is insufficient to cope the high density mounting. In addition, in the case of the method in which by using a $CO_2$ laser or an excimer laser, holes are formed on a cover lay film, the position precision is good, but there is a disadvantage in that equipment cost and equipment maintaining cost are high.

Accordingly, currently, in order to solve this problem, a method in which by using a photosensitive resin composition, the fineness of a circuit pattern and a position precision are improved by a photolithography process has been suggested. In the case of when the photosensitive resin composition is used, fine holes that are required to connect a circuit are capable of being precisely formed at a desired position by thermal compressing a liquid or film type photosensitive resin composition on a circuit of a CCL, UV exposing it according to the pattern, developing it by using a developing solution, washing it with water, drying it, and thermally curing it.

In the case of the developing solution that is used in the developing process, in general, a combustible organic solvent or a toxic solvent is used, and they have a problem in terms of operation stability. Accordingly, currently, a photosensitive resin composition that is advantageous in terms of operation stability and is capable of being developed by a weak alkali aqueous solution is required, and many studies thereof have been made. In order to develop it in respects to the alkali aqueous solution, in the case of when a photosensitive resin composition including a base resin and a functional group such as a carbonic acid, an alcoholic group such as phenol, or a multibase acid is used, there are problems in that the developability in respects to the alkali aqueous solution is increased, but resistance to solvent, resistance to chemicals, and dielectricity are reduced, thus it is not suitable to circuit boards such as FPCB (Flexible Printed Circuit Board). In addition, in the case of the photosensitive resin composition that is produced by adding acrylate and the like to known epoxy resin that is used in the dry film, since the flame retardancy property is poor and the soldering heat resistance after the curing is insufficient, there are problems in that the resin is discolored during the soldering and the delamination occurs in circuits. In addition, since the flexibility and the resistance to bendability are poor, while the repeating folding occurs, cracks are easily formed, thus it is not suitable to be used as a protective film of a circuit board.

In order to solve these problems, a demand for a photosensitive resin for circuit protection on the basis of polyimide that has the high heat resistance, resistance to bendability and dielectric property, and is applied to a known protective film for circuit pattern is high. However, even though these requirements are present, there are several technical problems in use of polyimide as a material of a photosensitive circuit protective film. In the case of when polyimide is used as the photosensitive resin, it is used in a polyamic acid form that is a precursor of polyimide which is advantageous of shaping, and in this case, the high temperature of not less than 350° C. is required to polyimidize the polyamic acid. Therefore, in the case of when it is polyimidized through a thermal curing process while it is coated on the circuit pattern in a polyamic acid form or attached in a film form, there are problems in that the copper circuit that is weak to heat may be oxidized and deteriorated, which is undesirable. In addition, in the photosensitive protective film, voids between fine patterns must be filled, in general, since polyimide has high modulus, it is not easy to realize the filling property, and since resistance to chemicals is excellent, it is hard to realize the developability in respects to the weak alkali aqueous solution, there is a limit in development of a circuit protective film that is made of polyimide.

DISCLOSURE OF INVENTION

Technical Problem

Therefore, it is an object of the present invention to provide a photosensitive resin composition that has excellent resolution, is capable of being developed by an alkali aqueous solution, and has excellent heat resistance, adhesion property, dielectric property and resistance to chemicals, and a dry film that is produced from the same.

Technical Solution

Accordingly, the present invention provides a photosensitive resin composition which comprises a polyamic acid resin, two or more (meth)acrylate-based compounds that include one or more double bonds between carbons, a photopolymerization initiator, a phosphorus-based flame retardant, and an organic solvent.

In addition, the present invention provides a dry film that is produced by using the photosensitive resin composition.

In addition, the present invention provides a multilayered print wiring board, a flexible circuit substrate, or a laminate body for semiconductor, which comprises the dry film as a protective film or an insulating film.

ADVANTAGEOUS EFFECTS

The photosensitive resin composition according to the present invention has excellent resolution, is capable of being developed by an alkali aqueous solution such as a sodium carbonate aqueous solution, a potassium hydroxide aqueous solution, and a sodium hydroxide aqueous solution at a low concentration, and satisfies excellent heat resistance, adhesion property, dielectric property and resistance to chemicals, thus being applied to COF (Chip On Film) and the like that require a solder resist and a fine pitch of a high integrated semiconductor. In addition, the photosensitive resin composition according to the present invention and processed gods thereof may solve the problems of the low flexibility and the low bendability that are considered the problems of a known photosensitive resin composition that is on the basis of acryl and epoxy and a coverlay that is produced by using the same, and provides the stability of the process and convenience of the process operation by reducing a curing temperature that is required to 350° C. or more to 230° C. or less.

BEST MODE FOR CARRYING OUT THE INVENTION

Hereinafter, the present invention will be described in detail.

The present invention provides a photosensitive resin composition which comprises a) a polyamic acid that is represented by the following Formula 1, b) two or more (meth) acrylate-based compounds that include one or more double bonds between carbons, c) a photopolymerization initiator, d) a phosphorus-based flame retardant, and e) an organic solvent.

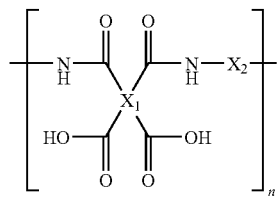

[Formula 1]

wherein $X_1$ represents a tetravalent organic group that includes an aromatic ring structure, and $X_2$ represents a divalent organic group that includes an aromatic ring structure.

Preferably, $X_1$ is selected from the group consisting of:

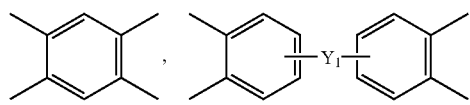

$X_2$ is selected from the group consisting of:
and

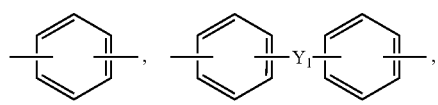

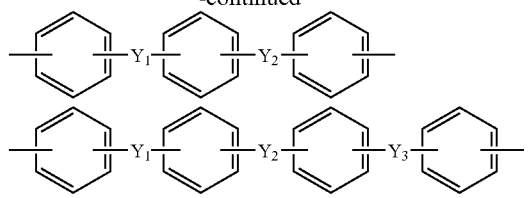

wherein $Y_1$ to $Y_3$ are each independently or simultaneously a direct bond, —O—, —CO—, —S—, —SO$_2$—, —CONH—, —(CH$_2$)$_n$—, —C(CF$_3$)$_2$—, or —C(CH$_3$)$_2$—, and n is an integer in which n≥1.

It is preferable that a) the polyamic acid is produced by using one or more diamine compounds that include an aromatic ring molecule structure and one or more acid dianhydride compounds that include an aromatic ring molecular structure. For example, it is more preferable that the polyamic acid is produced by using one or more diamine compounds that are represented by the following Formula 2 and at least one of one or more acid dianhydride compound that are represented by Formula 3 or Formula 4.

$$H_2N—X_2—NH_2 \quad \text{[Formula 2]}$$

wherein $X_2$ is selected from the group consisting of
and

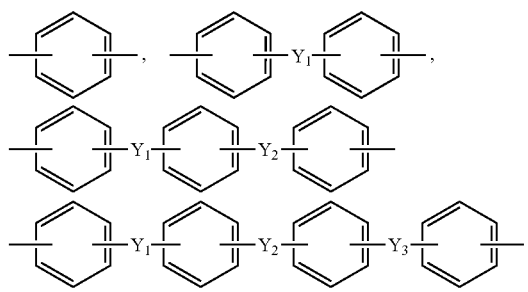

wherein $Y_1$ to $Y_3$ are the same as the above definition.

As specific example of diamine, there are p-PDA (p-phenylenediamine), m-PDA (m-phenylenediamine), 4,4'-ODA (4,4'-oxydianiline), 3,4'-ODA (3,4'-oxydianiline), BAPP (2,2-bis(4-[4-aminophenoxy]-phenyl)propane), TPE-R (1,3-bis(4-aminophenoxy)benzene), TPE-Q (1,4-bis(4-aminophenoxy)benzene), m-BAPS (2,2-bis(4-[3-aminophenoxy]phenyl)sulfone) and the like, but the examples are not limited thereto.

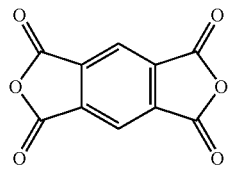

[Formula 3]

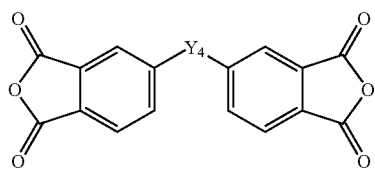

[Formula 4]

wherein $Y_4$ is the same as the definition of $Y_1$ to $Y_3$.

As specific examples of acid dianhydride, there are pyromelitic dianhydride, 3,3'-4,4'-biphenyltetracarboxylic dianhydride, 3,3',4,4'-benzophenone tetracarboxylic dianhydride, 4,4'-oxydiphthalic anhydride, 4,4'-(4,4'-isopropylbiphenoxy)bisphthalic anhydride), 2,2'-bis-(3,4-dicarboxylphenyl) hexafluoropropane dianhydride, TMEG (ethylene glycol bis(anhydro-trimellitate) and the like, but the examples are not limited thereto.

The polyamic acid according to the present invention may be produced by using a method that is known in the art. In detail, by dissolving sequentially one or more diamine compounds that are represented by Formula 2 in a solvent, adding one or more acid dianhydride compounds that are represented by Formula 3 or Formula 4, and reacting them, the polyamic acid may be produced. It is preferable that the reaction of the diamine compound and the acid dianhydride compound starts at a temperature range of 0 to 5° C. and is performed for generally 24 hours or so until the reaction is completed at a temperature range of 10 to 40° C. At this time, it is preferable that the diamine compound and the acid dianhydride compound are mixed with each other at a molar ratio of 1:0.9 to 1:1.1. If the molar ratio of the diamine compound and the acid dianhydride compound is less than 1:0.9, since the molecular weight thereof is very low, the production of polyimide that has excellent mechanical properties may be difficult. On the contrary, if the molar ratio of the diamine compound and the acid dianhydride compound is more than 1:1.1, since the viscosity is very high, processes that are required in coating and operation may be difficult.

The mass average molecular weight of the polyamic acid that is produced by using the above method is in the range of preferably 5,000 to 300,000, and more preferably 8,000 to 20,000. If the mass average molecular weight of the polyamic acid is less than 5,000, since the molecular weight and the viscosity of the produced polyamic acid composition become low, physical properties of the produced polyimide resin may become weak. In addition, if the mass average molecular weight of the polyamic acid is more than 300,000, since the viscosity of the polyamic acid varnish is too high, the treatment thereof may be difficult.

As the solvent, one or more that are selected from the group consisting of N-methylpyrrolidinone (NMP), N,N-dimethyl acetamide (DMAc), tetrahydrofurane (THF), N,N-dimethyl formamide (DMF), dimethylsulfoxide (DMSO), cyclohexane, acetonitrile and a mixture thereof may be used, but are not limited thereto.

The photosensitive resin composition according to the present invention includes b) two or more (meth)acrylate-based compounds that include one or more double bonds between carbons. In detail, it is preferable that the composition include one or more (meth)acrylates that have two photopolymerizable double bonds between carbon atoms and at least one of a (meth)acrylate compound that includes one or more photopolymerizable double bonds between carbon atoms, a (meth)acrylate compound that includes a hydroxyl group, and a (meth)acrylate compound that includes one or more photopolymerizable double bond between carbon atoms and an epoxy group.

Two or more (meth)acrylate-based compounds that include one or more double bonds between carbon atoms have excellent compatibility with the polyamic acid. In addition, by including two or more (meth)acrylate components, the excellent developability and photosensitive of the alkali solution of the photosensitive resin composition may be realized. In addition, when the photosensitive resin composition is processed by the dry film, since the modulus becomes low while the heat processing is performed and the fluidity is provided while the heat lamination is performed, the filling property of the uneven pattern may be improved. Accordingly, the heat lamination process is capable of being carried out at a relatively low temperature. In addition, the dry film that is produced from the photosensitive resin composition that includes the (meth)acrylate compounds including the epoxy group is capable of improving the adhesion strength and the hydrolysis resistance in respects to the copper clad.

As the (meth)acrylate that has two photopolymerizable double bonds between carbon atoms, the EO or PO modified (meth)acrylate compound is preferable, and as the specific example, it may be represented by the following Formula 5.

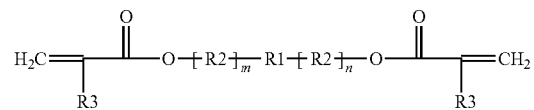

[Formula 5]

wherein

R1 is an aromatic that has two or more benzene rings in a molecule thereof, and specific examples thereof include bisphenol A, bisphenol F, bisphenol S or the like, R2 is an ethylene oxide or propylene oxide group, R3 is hydrogen or a methyl group, m and n are each an integer of not less than 2, and a value of m+n is an integer in the range of 4 to 30.

As examples of the compound which belongs to Formula 5, there are A-BPE-10, A-BPE 20, A-BPE-30, BPE-500, and BPE-900 manufactured by NK Ester, bisphenol A EO modified (meth)acrylate, bisphenol F EO modified (meth)acrylate, and PO modified (meth)acrylate manufactured by Shin-Nakamura chemical, Co., Ltd., or Kongyoungsa, Inc., SR-480, SR-602, and CD-542 manufactured by Stomer, Co., Ltd. and the like, but they are not limited thereto.

In addition, as the (meth)acrylate compound that has two photopolymerizable double bonds between carbon atoms, the compound of the following Formula 6 may be preferably used.

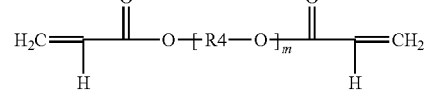

[Formula 6]

wherein

R4 is an organic group that includes 1 to 10 carbon atoms and hydrogen, or 1 to 10 carbon atoms, oxygen and hydrogen, and preferably an ethyl group or a propyl group.

At this time, m is an integer in the range of 1 to 14.

As specific examples of the (meth)acrylate compound that is represented by Formula 6, there are triethylene glycol diacrylate, neopentylglycol diacrylate, 1,6-hexanediol diacrylate, 3-methyl-1,5-pentanediol diacrylate, 2-butyl-2-ethyl-1,3-propanediol diacrylate, 1,9-nonanediol diacrylate, polyethyleneglycol diacrylate, PEG#200 diacrylate, PEG#400 diacrylate or PEG#600 diacrylate manufactured by Kongyoungsa, Inc. and the like, but they are not limited thereto.

The (meth)acrylate-based compound that includes one or more photopolymerizable double bonds between carbon atoms and a hydroxyl group may be represented by the following Formula 7.

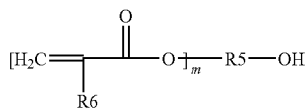

[Formula 7]

wherein

R5 is an organic group that includes 2 to 8 carbon atoms, oxygen and hydrogen, and preferably 2-hydroxy ethyl, hydroxy propyl, phenyl glycidyl ester group.

R6 is hydrogen or a methyl group, and m is an integer in the range of 1 to 3.

As specific examples of the compound that is represented by Formula 7, there are 2-hydroxyethyl methacrylate (HEMA), 2-hydroxypropyl methacrylate, 2-hydroxy acrylate, 2-hydroxy propylacrylate, 2-hydroxybutyl methacrylate, phenylglycidylester acrylate (Nipponkayaku, Co., Ltd., R-128H), 1,6-hexanediol epoxy acrylate (Nipponkayaku, Co., Ltd., Kayarad R-167), Ebecryl 9695 and the like, but they are not limited thereto.

The (meth)acrylate compound that includes one or more photopolymerizable double bonds between carbon atoms and the epoxy group may be represented by the following Formula 8.

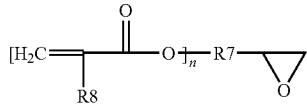

[Formula 8]

wherein

R7 is an organic group that includes 1 to 6 carbon atoms and hydrogen, and preferably a methyl group.

R8 is hydrogen or a methyl group, and n is an integer in the range of 1 to 3.

As specific examples of the compound that is represented by Formula 8, there are a glycidyl compound such as glycidyl (meth)acrylate, NK oligomer EA 1010, EA-6310 manufactured by Shin-Nakamura chemical, Co., Ltd., and the like, but they are not limited thereto.

It is preferable that the amount of the (meth)acrylate-based compound that includes the double bond between carbons is in the range of 30 to 150 parts by weight on the basis of 100 parts by weight of the polyamic acid of the photosensitive resin composition according to the present invention. In the case of when the content of the (meth)acrylate-based compound that includes the double bond between carbon atoms is less than 30 parts by weight, the development property and pattern filling property may be reduced, and in the case of when the content is more than 150 parts by weight, the heat resistance may be reduced and the mechanical property of the film that includes the flexibility may be reduced.

The photosensitive resin composition according to the present invention includes c) a photopolymerization initiator. It is preferable that the amount of the photopolymerization initiator is in the range of 0.3 to 10 parts by weight on the basis of the 100 parts by weight of the polyamic acid of the photosensitive resin composition according to the present invention. In the case of when the content of the photopolymerization initiator is less than 0.3 parts by weight, the photocuring participation of the photopolymerization initiator is reduced, and in the case of when the content is more than 50 parts by weight, radicals that do not participate in the curing may reduce the physical properties of the film that is produced from the photosensitive resin composition.

As specific examples of the photopolymerization initiator, there are an acetophenone-based compound such as 2-hydroxy-2-methyl-1-phenylpropane-1-on, 1-(4-isopropylphenyl)-2-hydroxy-2-methylpropane-1-on, 4-(2-hydroxyethoxy)-phenyl-(2-hydroxy-2-propyl)ketone, 1-hydroxycyclohexylphenylketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propane-1-on, 2-benzyl-2-dimethylamino-1-(4-morpholinophenyl)-butane-1-on, 2-methyl-1-[4-(methylthio)phenyl]-2-morpholinopropane-1-on and the like; a biimidazole-based compound such as 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4', 5,5'-tetraphenyl 2,2'-bis(o-chlorophenyl)-4,4',5,5'-tetraphenyl-1,2'-biimidazole and the like; a triazine-based compound such as 3-{4-[2,4-bis(trichloromethyl)-s-triazine-6-yl]phenylthio}propionic acid, 1,1,1,3,3,3-hexafluoroisopropyl-3-{4-[2,4-bis(trichloromethyl)-s-triazine-6-yl]phenylthio}propionate, ethyl-2-{4-[2,4-bis(trichloromethyl)-s-triazine-6-yl]phenylthio}acetate, 2-epoxyethyl-2-{4-[2,4-bis(trichloromethyl)-s-triazine-6-yl]phenylthio}acetate, cyclohexyl-2-{4-[2,4-bis(trichloromethyl)-s-triazine-6-yl]phenylthio}acetate, benzyl-2-{4-[2,4-bis(trichloromethyl)-s-triazine-6-yl]phenylthio}acetate, 3-{chloro-4-[2,4-bis(trichloromethyl-s-triazine-6-yl] phenylthio}propionic acid, 3-{4-[2,4-bis(trichloromethyl-s-triazine-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3-butadienyl-s-triazine, 2-trichloromethyl-4-amino-6-p-methoxystyryl-s-triazine and the like; and an oxime-based compound such as CGI-242 and CGI-124 manufactured by Chiba, Co., Ltd. in Japan.

The photosensitive resin composition according to the present invention may further include a photocrosslinking sensitizer that promotes the occurrence of radicals as an auxiliary component and a curing accelerator that promotes the curing in an amount in the range of 0.01 to 10 parts by weight on the basis of 100 parts by weight of the polyamic acid of the photosensitive resin composition. More preferably, they may be included in an amount in the range of 0.1 to 5 parts by weight on the basis of 100 parts by weight of the polyamic acid.

As specific examples of the photocrosslinking sensitizer, a benzophenone-based compound such as benzophenone, 4,4-bis(dimethylamino)benzophenone, 4,4-bis(diethylamino) benzophenone, 2,4,6-trimethylaminobenzophenone, methyl-o-benzoylbenzoate, 3,3-dimethyl-4-methoxybenzophenone, 3,3,4,4-tetra(t-butylperoxycarbonyl)benzophenone and the like; a fluorenone-based compound such as 9-fluorenone, 2-chloro-9-fluorenone, 2-methyl-9-fluorenone and the like; a thioxanthone-based compound such as thioxanthone, 2,4-diethyl thioxanthone, 2-chloro thioxanthone, 1-chloro-4-propyloxy thioxanthone, isopropyl thioxanthone, diisopropyl thioxanthone and the like; a xanthone-based compound such as xanthone, 2-methylxanthone and the like; an anthraquinone-based compound such as anthraquinone, 2-methyl anthraquinone, 2-ethyl anthraquinone, t-butyl anthraquinone, 2,6-dichloro-9,10-anthraquinone and the like; an acridine-based compound such as 9-phenylacridine, 1,7-bis(9-acrydinyl)heptane, 1,5-bis(9-acrydinylpentane) or 1,3-bis(9-acrydinyl)propane and the like; a dicarbonyl-based compound such as benzyl, 1,7,7-trimethyl-bicyclo[2,2,1] heptane-2,3-dion, 9,10-phenanthrenequinone and the like; a phosphine oxide-based compound such as 2,4,6-trimethylbenzoyl diphenylphosphine oxide, bis(2,6-dimethoxybenzoyl)-2,4,4-trimethylpentyl phosphine oxide and the like; a benzoate-based compound such as methyl-4-(dimethylamino)benzoate, ethyl-4-(dimethylamino)benzoate, 2-n-butoxyethyl-4-(dimethylamino)benzoate and the like; an amino synergist-based compound such as 2,5-bis(4-diethylaminobenzale)cyclopentanone, 2,6-bis(4-diethylaminobenzale) cyclohexanone, 2,6-bis(4-diethylaminobenzale)-4-methylcyclopentanone and the like; a coumarine-based compound such as 3,3-carbodinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine or 10,10-carbonylbis[1,1,7,7-tetramethyl-2,3,6,7-tetrahydro-1H,5H,11H—C1]-benzopyran o[6,7,8-ij]-quinolizine-11-on and the like; and a chalcone compound such as 4-diethylamino chalcone, 4-azidebenzalacetophenone and the like; 2-benzoylmethylene, or 3-methyl-b-naphthothiazoline may be used.

In addition, as specific examples of the curing promoting agent, 2-mercaptobenzoimidazole, 2-mercaptobenzothiazol, 2-mercaptobenzooxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate), trimethylolpropane-tris(3-mercaptopropionate) and the like may be used. If the content of the photosensitizer deviates from the above range, a sensitizing effect may not be obtained or it may negatively affect the developability.

In addition, the photosensitive resin composition according to the present invention includes a d) phosphorus-based flame retardant. The phosphorus-based flame retardant has the compatibility in respects to the polyamic acid solution and the polyamic acid solution that includes the (meth)acrylate compound. In detail, as shown in the following Formula 9, the phosphorus-based flame retardant may include one or more that are selected from a compound that includes phosphorus and (meth)acrylate in a structure thereof, a phosphorus-based compound that is represented by the following Formula 10, and a phosphorus-based compound that is produced by using an addition material of the compound that is represented by the following Formula 9 or Formula 10 and a compound that includes one or more epoxy group or (meth)acryl group in a molecule thereof.

[Formula 9]

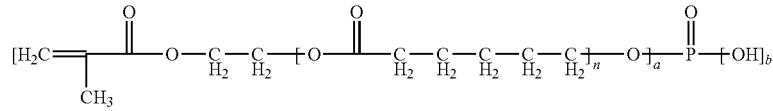

wherein
n is an integer in which 0<n<10,
a, b are each an integer, and a+b is 3.

[Formula 10]

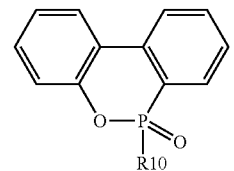

wherein
R10 is

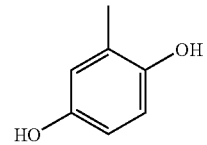

or hydrogen.

The phosphorus-based flame retardant may have the compatibility in respects to the photosensitive resin composition according to the present invention and provide the required flame retardancy. It is preferable that the flame retardant is added in an amount of 0.1 to 20 wt %, and more preferably 0.5 to 5 wt % in terms of the content ratio of the phosphorus atom on the basis of the total solid weight except for the polyamic acid of the photosensitive resin composition according to the present invention. In the case of when the content of the phosphorus-based flame retardant is less than 0.1 wt %, it is difficult to realize the flame retardancy, and in the case of when the content is more than 20 wt %, the mechanical properties of the film that includes the developability may be reduced.

As specific examples of the flame retardant, there may be 2-hydroxyethyl methacrolate phosphate (trademark: KAYAMER PM-2) and 2-hydroxyethyl methacrolate caprolactone phosphate (trademark; KAYAMER PM-21) as examples corresponding to Formula 9. As representative examples of the phosphorus-based flame retardant corresponding to Formula 10, there may be 10-(2,5-dihydroxyphenyl)-10H-9-oxa-10-phosphaphenanthrene-10-oxide (HCA-HQ), and 9,10-dihydro-9-oxa-10-phosphaphenanthrene-10-oxide (HCA). The phosphorus-based compounds that is produced by using an addition material of the compound that is represented by Formula 9 or Formula 10 and the compound that includes one or more epoxy groups or (meth)acryl groups in a molecule thereof correspond to this.

As the compound that includes (meth)acrylate in a molecule thereof, one or more compounds that are selected from the group consisting of 2-hydroxyethyl(meth)acrylate, benzyl(meth)acrylate, phenoxypolyethylene(meth)acrylate, methoxypolypropyleneglycol(meth)acrylate, 2-hydroxypropyl(meth)acrylate, (meth)acryloyloxyethylhydrogenphthalate, 1,6-hexanediol di(meth)acrylate, ethanediol di(meth)acrylate, methylene bis(meth)acrylate, neopentylglycol di(meth)acrylate, 2-hydroxypropanedial di(meth)acrylate, isopropyldiol di(meth)acrylate and isopropyleneglycol di(meth)acrylate may be used, but they are not limited thereto.

The photosensitive resin composition according to the present invention includes e) the organic solvent. The organic solvent that easily dissolves a) the polyamic acid, b) two or more (meth)acrylate-based compounds that include one or more double bonds between carbons, c) a photopolymerization initiator, d) a phosphorus-based flame retardant compound is used, and in particular, it is preferable to use the solvent that is easily dried while performing the coating process. It is preferable that the content of the organic solvent is in the range of 300 to 700 parts by weight on the basis of 100 parts by weight of the polyamic acid of the photosensitive resin composition according to the present invention.

It is preferable that the organic solvent is a nonprotonic polar organic solvent in views of solubility, and as specific examples thereof, one or more mixtures that are selected from the group consisting of N-methyl-2-pyrrolidone, N-acetyl-2-pyrrolidone, N-benzyl-2-pyrrolidone, N,N-dimethyl formamide, N,N-dimethyl acetamide, dimethyl sulfoxide, hexamethyl phosphortriamide, N-acetyl-∈-caprolactam, dimethyl imidazolidinone, diethylene glycol dimethyl ether, triethylene glycol dimethyl ether, γ-butyrolactone, dioxane, dioxolan, tetrahydrofuran, chloroform and methylene chloride may be used, but are not limited thereto.

In addition, the present invention may further include an additive such as an antifoaming agent, a leveling agent, and an antigelling agent and the like in order to make coating or curing easy or to improve other properties if necessary.

In addition, the present invention provides a dry film that is produced by using the photosensitive resin composition.

The dry film according to the present invention may be produced by coating the photosensitive resin composition on the support by a known method and drying it. The support is capable of stripping a photosensitive resin composition layer, and it is preferable that the support has the excellent light transparency. In addition, it is preferable that the flatness of the surface thereof is excellent.

As specific examples of the support, there may be various plastic films such as polyethylene terephthalate, polyethylene naphthalate, polypropylene, polyethylene, 3 cellulose acetate, 2 cellulose acetate, poly(meth)acrylic acid alkyl ester, a poly(meth)acrylic acid ester copolymer, polyvinyl chloride, polyvinyl alcohol, polycarbonate, polystyrene, cellophane, a polyvinyl chloridene copolymer, polyamide, polyimide, a vinyl chloride vinyl acetate copolymer, polytetrafluoroethylene, polytrifluoroethylene and the like. In addition, the complex material that consists of two or more species thereof may be used, and it is particularly preferable that the polyethylene terephthalate film having the excellent light permission is used. The thickness of the support is in the range of preferably 5 to 150 μm and more preferably 10 to 50 μm.

The coating method of the photosensitive resin composition is not particularly limited, and for example, methods such as a spray method, a roll coating method, a rotation coating method, a slit coating method, a compression coating method, a curtain coating method, a die coating method, a wire bar coating method or a knife coating method may be used. The drying of the photosensitive resin composition varies according to the constitution component, the kind of organic solvent, and the content ratio, but it is preferable that the drying is carried out at 60 to 100° C. for 30 sec to 15 min.

The film thickness of the dry film that is produced by coating the photosensitive resin composition according to the present invention on the support, drying it and curing it is in the range of preferably 5 to 95 μm and more preferably 10 to 50 μm. If the film thickness of the dry film is less than 5 μm, the insulating property is not pod, and if the film thickness is more than 95 μm, the resolution may be reduced.

In addition, the present invention provides a multilayered print wiring board that is produced by using the dry film.

As an example of the multilayered print wiring board, the dry film may be formed by using a plane compression method or a roll compression method on a circuit formed surface at a temperature in the range of 25 to 50° C. by forming the photosensitive coating film through a vacuum lamination method at 60 to 90° C. after the pre-lamination. In the dry film, the pattern may be formed by exposing using the photomask in order to form the fine hole or the fine width line. The exposure amount varies according to the kind of light source and the thickness of the film used in the UV exposing, but in general, the exposure amount is in the range of preferably 100 to 1200 mJ/cm$^2$, and more preferably 100 to 400 mJ/cm$^2$. As the active rays, there are electronic rays, ultraviolet rays, X-rays and the like, but preferably, the ultraviolet rays may be used, and a high pressure mercury lamp, a low pressure mercury lamp, a halogen lamp and the like may be used as the light source.

While developing after the exposure, in general, a precipitation method is used to dip it in the developing solution. As the developing solution, an alkali aqueous solution such as a sodium hydroxide aqueous solution or a sodium carbonate aqueous solution is used, and after the development is performed by using the alkali aqueous solution, it is washed. Next, according to the pattern that is obtained by the development through the heat processing process, the polyamic acid is changed into polyimide, and it is preferable that the temperature that is required in the heating treatment or the degree of imidization is in the range of 150 to 230° C. At this time, it is more effective to continuously increase the heating temperature through 2 to 4 steps with an appropriate temperature profile, but in some cases, the curing may be carried out at a predetermined temperature. By carrying out the above process, the multilayered print wiring board is capable of being obtained.

In addition, the present invention provides a flexible circuit substrate or a laminate body for semiconductor using the dry film as a protective film or an interlayer insulating film.

The constitution and the production method of the printed circuit board or the laminate body for semiconductor may use a technology that is known in the art, except that the dry film according to the present invention is used as the protective film or the interlayer insulating film.

A better understanding of the present invention may be obtained in light of the following Examples which are set forth to illustrate, but are not to be construed to limit the present invention.

MODE FOR THE INVENTION

EXAMPLE

<Production of the Polyamic Acid>

Preparation Example 1 (PAA1)

While nitrogen flew into the four neck round bottom flask that was provided with the thermometer, the agitator, the nitrogen input port, and the powder dispensing funnel, 780 g of N,N-dimethyl acetamide (DMAc) was added to 23.24 g of 4,4'-oxydianiline (4,4'-ODA) and 79.16 g of 1,3-bis(4-aminophenoxy)benzene (TPE-R)), and agitated to completely dissolve. The solution was cooled to not more than 15° C., 117.60 g of 4,4'-oxydiphthalic anhydride (ODPA) was slowly added and agitated to obtain the polyamic acid varnish.

Preparation Example 2 (PAA2)

90.45 g of 2,2'-bis(4-[3-aminophenoxy]phenyl)sulfone (m-BAPS) and 27.92 g of 4,4'-oxydianiline (4,4'-ODA) were used as diamine, and 101.63 g of 3,3',4,4'-biphenyltetracarboxylic dianhydride (BPDA) was used as dianhydride to obtain the polyamic acid varnish by using the same method as Preparation Example 1.

Preparation Example 3 (PAA3)

23.48 g of 4,4'-oxydianiline (4,4'-ODA) and 79.99 g of 1,3-bis(4-aminophenoxy)benzene (TPE-R) were used as diamine, and 37.22 g of 3,3',4,4'-benzophenone tetracarboxylic dianhydride (BTDA) and 79.30 g of 3,3',4,4'-biphenyltetracarboxylic dianhydride (BPDA) was used as dianhydride to obtain the polyamic acid varnish by using the same method as Preparation Example 1.

Preparation Example 4 (PAA4)

29.18 g of 1,4-diaminocyclohexane (DACH) that was aliphatic amine and 76.17 g of 1,3-bis(4-aminophenoxy)benzene (TPE-R) were used as diamine, and 114.65 g of 1,4-cyclohexanedianhydride (CHDA) that was aliphatic anhydride was used as dianhydride to obtain the polyamic acid varnish by using the same method as Preparation Example 1.

<Production of the Photosensitive Resin Composition>

Example 1

15 parts by weight of A-BPE-20 (Daiich Chemical) as the (meth)acrylate-based compound, 15 parts by weight of kayarad R-128H (Nipponkayaku), 1.5 parts by weight of kayamer PM-2 (Nipponkayaku) as the flame retardant, and 0.3 parts by weight of Irgacure 651 and 0.2 parts by weight of Irgacure 369 as the photopolymerization initiator were put into 100 parts by weight of the polyamic acid varnish that was obtained by using the method of Preparation Example 2, and mixed with each other to produce the photosensitive resin composition. After the photosensitive resin composition was coated on the PET film by using the doctor blade to 80 μm, it was dried at 80° C. in the oven for 10 min to obtain the dry film having the thickness of 25 μm. This dry film was put on the copper clad of the 2CCL product having the pattern, subjected to the vacuum lamination at 70° C. for 30 sec, cured under the nitrogen atmosphere at 220° C. in the oven for 1 hour, and evaluated.

Example 2 to 5 and Comparative Example 1 to 4

As shown in the following Table 1, the polyamic acids that were produced in Preparation Examples 1 to 4, the (meth)acrylate-based compound composition including one or more double bonds between carbon atoms, and the photosensitive resin compositions were produced by using the same method as Example 1 while the composition was changed.

In Comparative Example 3, the photosensitive resin composition was produced by using the same method as Example 1, but the dry film was not produced because of the phase separation, and it was deemed that there was no compatibility, thus the evaluation except for the compatibility was not carried out.

TABLE 1

|  | Example | | | | | Comparative Example | | | |
| --- | --- | --- | --- | --- | --- | --- | --- | --- | --- |
|  | 1 | 2 | 3 | 4 | 5 | 1 | 2 | 3 | 4 |
| PAA1 | — | 100 | — | 100 | — | — | 100 | — | — |
| PAA2 | 100 | — | — | — | 100 | 100 | — | 100 | — |
| PAA3 | — | — | 100 | — | — | — | — | — | — |
| PAA4 | — | — | — | — | — | — | — | — | 100 |
| 9-EGDA | — | 10 | 5 | — | 10 | — | — | — | — |
| A-BPE-20 | 15 | — | 5 | 5 | — | 15 | — | 15 | 15 |
| R-128H | 15 | 5 | — | 20 | — | 15 | 10 | — | 15 |
| R-167 | — | 10 | 15 | — | 10 | — | — | — | — |
| GMA | — | 5 | 5 | 5 | 10 | — | — | — | — |
| T-1420(T) | — | — | — | — | — | — | 20 | — | — |
| S-503TS | — | — | — | — | — | — | — | 15 | — |
| PM-2 | 1.5 | 15 | 1.5 | 1.5 | 1.5 | — | 1.5 | 1.5 | 1.5 |

9-EGDA: polyethylene glycol diacrylate (SK cytec)
A-BPE-20: bisphenol A diacrylate(Daiich Chemical)
R-128H: phenylglycidylester acrylate (Nipponkayaku)
GMA: glycidyl methacrylate
R-167: 1,6-hexanediol diacrylate(Nipponkayaku)
T-1420(T): ditrimethylolpropane tetraacrylate (Nipponkayaku)
S-503TS: methacrylate oligosiloxane (Shinetsu Chemical)
PM-2: 2-hydroxyethyl methacrolate phosphoate (trademark: KAYAMER PM-2)

Experimental Example

The physical properties of the photosensitive resin compositions that were produced in Examples 1 to 5 and Comparative Examples 1 to 3 were measured according to the following evaluation method, and the results are described in Table 2.

1. Compatibility

The polyamic acid varnish and the (meth)acrylate-based compound were mixed with each other at a weight ratio of 75/25, coated by using the doctor blade, and dried at 80° C. in the oven, and the phase separation of the produced dry film was checked.

2. Developability

The produced dry film was subjected to the vacuum lamination on the copper clad, exposed at 350 mJ/cm², and subjected to the spray development by using the 1 wt % sodium carbonate aqueous solution of 35° C., and whether the development was possible or not was checked by using the pitch of L/S=50 μm/50 μm.

3. Adhesion Strength

The cross cut fill was measured (JIS K5404).

4. Lead Heat Resistance

The dry film was put in the lead bath at 288±5° C. while the dry film surface faced upward to float it for 1 min, and the dry film was checked.

5. Bendability

On the FCCL pattern of L/S=100 μm/100 μm, the dry film was subjected to the vacuum lamination, exposed, developed, and cured, and the bendability was measured by using the MIT method (0.38R, 500 g load) (JIS C6471).

6. Resistance to Chemicals

It was dipped in 10 (v/v) % H₂SO₄ solution, 10 (v/v) % NaOH solution, and isopropyl alcohol (IPA) at room temperature for 10 min, and the stripping and the discoloration were checked.

7. Flame Retardancy

It was on the basis of the vertical combustion test of UL94.

<Evaluation Standard of the Flame Retardancy>

VTM-0: excellent, VTM-1: middle, VTM-2: bad

The evaluation of the physical properties of the photosensitive resin composition is described in the following Table 2.

The invention claimed is:

1. A photosensitive resin composition comprising:
   a) a polyamic acid that is represented by the following Formula 1;
   b) two or more (meth)acrylate-based compounds that include one or more double bonds between carbons;
   c) a photopolymerization initiator;
   d) a phosphorus-based flame retardant; and
   e) an organic solvent:

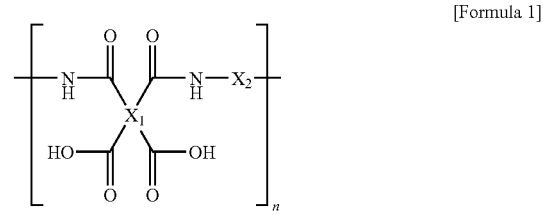

[Formula 1]

wherein $X_1$ represents a tetravalent organic group that includes an aromatic ring structure, and $X_2$ represents a divalent organic group that includes an aromatic ring structure;

wherein the polyamic acid is produced by using one or more diamine compounds that include an aromatic ring molecular structure and one or more acid dianhydride compounds that include an aromatic ring molecular structure, and the molar ratio of the one or more acid diamine compounds and the one or more acid anhydride compounds is 1:0.9 to 1:1.1;

wherein the mass average molecular weight of the polyamic acid is in the range of 5,000 to 300,000;

wherein b) two or more (meth)acrylate-based compounds that include one or more double bonds between carbons comprises i) one or more (meth)acrylates that have two photopolymerizable double bonds between carbon atoms, which is represented by the following Formula 5 or Formula 6, and ii) at least one of a (meth)acrylate compound selected from a (meth)acrylate compound

TABLE 2

| | Example | | | | | Comparative Example | | | |
|---|---|---|---|---|---|---|---|---|---|
| | 1 | 2 | 3 | 4 | 5 | 1 | 2 | 3 | 4 |
| Compatibility | no phase separation | no phase separation | no phase separation | no phase separation | no phase separation | no phase separation | no phase separation | phase separation | no phase separation |
| developability | 50/50 possible | 50/50 possible | 50/50 possible | 50/50 possible | 50/50 possible | 50/50 possible | 50/50 impossible | — | 50/50 possible |
| adhesion strength | 100/100 | 100/100 | 100/100 | 100/100 | 100/100 | 100/100 | 100/100 | — | 95/100 |
| lead heat resistance | no abnormality | no abnormality | no abnormality | no abnormality | no abnormality | no abnormality | no abnormality | — | no abnormality |
| bendability | 290 | 310 | 350 | 325 | 300 | 320 | 295 | — | 180 |
| resistance to chemicals | | | | | | | | — | |
| H₂SO₄ 10% | no abnormality | no abnormality | no abnormality | no abnormality | no abnormality | stripping | no abnormality | — | no abnormality |
| NaOH 10% | no abnormality | no abnormality | no abnormality | no abnormality | no abnormality | no abnormality | no abnormality | — | no abnormality |
| IPA | no abnormality | no abnormality | no abnormality | no abnormality | no abnormality | no abnormality | no abnormality | — | no abnormality |
| flame retardancy | VTM-0 | VTM-0 | VTM-0 | VTM-0 | VTM-0 | VTM-2 out | VTM-0 | — | VTM-0 | that includes one or more photopolymerizable double bonds between carbon atoms and a hydroxyl group, which is represented by the following Formula 7, and a (meth)acrylate compound that includes one or more photopolymerizable double bond between carbon atoms and an epoxy group, which is represented by the following Formula 8:

[Formula 5]

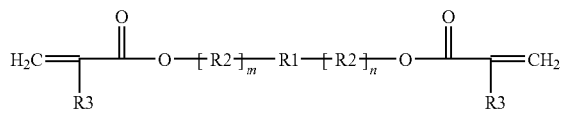

wherein

R1 is an aromatic that has two or more benzene rings in a molecule thereof,

R2 is an ethylene oxide or propylene oxide group,

R3 is hydrogen or a methyl group, m and n are each an integer of not less than 2, and a value of m +n is an integer in the range of 4 to 30,

[Formula 6]

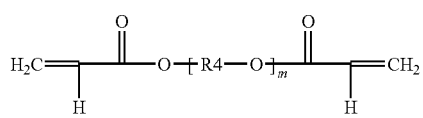

wherein

R4 is an organic group that includes 1 to 10 carbon atoms and hydrogen, or 1 to 10 carbon atoms, oxygen and hydrogen, and m is an integer in the range of 1 to 14,

[Formula 7]

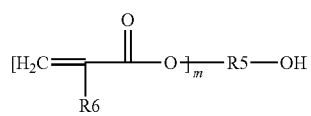

wherein

R5 is an organic group that includes 2 to 8 carbon atoms, oxygen and hydrogen,

R6 is hydrogen or a methyl group, and m is an integer in the range of 1 to 3,

[Formula 8]

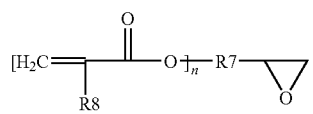

wherein

R7 is an organic group that includes 1 to 6 carbon atoms and hydrogen,

R8 is hydrogen or a methyl group, and n is an integer in the range of 1 to 3; and wherein the d) phosphorus-based flame retardant comprises a compound that is represented by the following Forula 9:

[Formula 9]

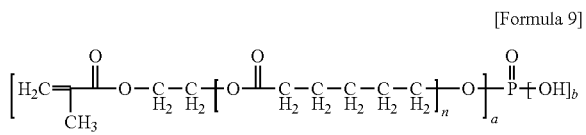

wherein n is an integer in which $0<n<10$, a, b are each an integer, and a+b is 3.

2. The photosensitive resin composition as set forth in claim 1, wherein $X_1$ of Formula 1 is a compound that is selected from the group consisting of:

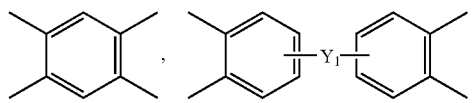

wherein $Y_1$ is each independently or simultaneously a direct bond, —O—, —CO—, —S—, —SO$_2$—, —CONH—, —(CH$_2$)$_n$—, —C(CF$_3$)$_2$—, or —C(CH$_3$)$_2$—, and n is an integer in which $n \geq 1$.

3. The photosensitive resin composition as set forth in claim 1, wherein $X_2$ of Formula 1 is a compound that is selected from the group consisting of:

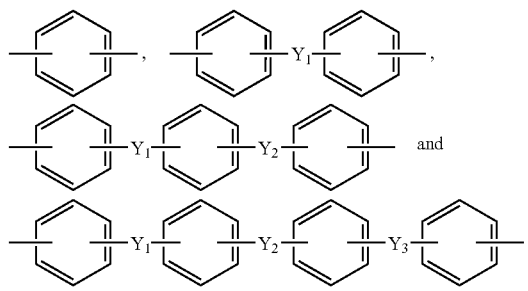

wherein $Y_1$ to $Y_3$ are each independently or simultaneously a direct bond, —O—, —CO—, —S—, —SO$_2$—, —CONH—, —(CH$_2$)$_n$—, or —C(CF$_3$)$_2$—, and n is an integer in which $n \geq 1$.

4. The photosensitive resin composition as set forth in claim 1, wherein the diamine compound is represented by the following Formula 2:

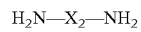  [Formula 2]

wherein $X_2$ is selected from the group consisting of:

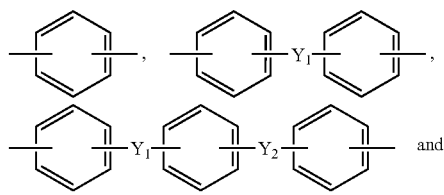

-continued

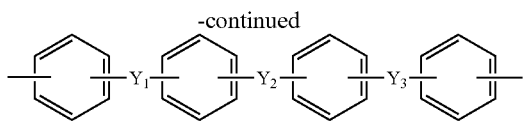

wherein
$Y_1$ to $Y_3$ are a direct bond, —O—, —CO—, —S—, —SO$_2$—, —CONH—, —(CH$_2$)$_n$—, —C(CF$_3$)$_2$—, or —C(CH$_3$)$_2$—, and n is an integer in which n ≥ 1.

5. The photosensitive resin composition as set forth in claim 1, wherein the acid dianhydride compound is represented by the following Formula 3 or Formula 4:

[Formula 3]

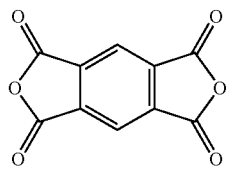

[Formula 4]

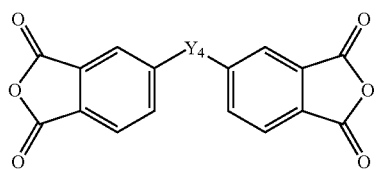

wherein
$Y_4$ is a direct bond, —O—, —CO—, —S—, —SO$_2$—, —CONH—, —(CH$_2$)$_n$—, —C(CF$_3$)$_2$—, or —C(CF$_3$)$_2$—, and n is an integer in which n≥1.

6. The photosensitive resin composition as set forth in claim 1, wherein the amount of b) two or more (meth)acrylate-based compounds that include one or more double bonds between carbons is in the range of 30 to 150 parts by weight on the basis of 100 parts by weight of the polyamic acid of the photosensitive resin composition.

7. The photosensitive resin composition as set forth in claim 1, wherein the amount of c) the photopolymerization initiator is in the range of 0.3 to 10 parts by weight on the basis of 100 parts by weight of the polyamic acid of the photosensitive resin composition.

8. The photosensitive resin composition as set forth in claim 1, further comprising:
a photocrosslinking sensitizer; and a curing accelerator.

9. The photosensitive resin composition as set forth in claim 8, wherein the amounts of the photocrosslinking sensitizer and the curing accelerator are in the range of 0.01 to 10 parts by weight on the basis of 100 parts by weight of the polyamic acid of the photosensitive resin composition.

10. The photosensitive resin composition as set forth in claim 1, wherein the amount of the phosphorus-based flame retardant is in the range of 0.1 to 20% by weight on the basis of the total solid weight except for the polyamic acid of the photosensitive resin composition.

11. The photosensitive resin composition as set forth in claim 1, wherein the amount of the organic solvent is in the range of 300 to 700 parts by weight on the basis of 100 parts by weight of the polyamic acid of the photosensitive resin composition.

12. A dry film that is produced by using the photosensitive resin composition according to claim 1.

13. The photosensitive resin composition as set forth in claim 1, wherein the amount of the phosphorus-based flame retardant is in a range of 0.5% to 5% by weight on the basis of a total solid weight except for the polyamic acid of the photosensitive resin composition.

* * * * *